United States Patent [19]
Heilig et al.

[11] Patent Number: 5,266,284
[45] Date of Patent: Nov. 30, 1993

[54] ARRANGEMENT FOR CARRYING OUT CRYSTAL GROWING EXPERIMENTS UNDER CONDITIONS OF WEIGHTLESSNESS

[75] Inventors: Franz Heilig, Tettnang; Lothar Potthast, Immenstaad, both of Fed. Rep. of Germany

[73] Assignee: Dornier GmbH, Fed. Rep. of Germany

[21] Appl. No.: 922,867

[22] Filed: Jul. 31, 1992

[30] Foreign Application Priority Data

Jul. 31, 1991 [DE] Fed. Rep. of Germany ... 9109446[U]

[51] Int. Cl.$^5$ .............................................. C30B 7/02
[52] U.S. Cl. .................................. 422/245; 422/253; 156/600; 156/DIG. 62; 156/DIG. 115
[58] Field of Search ....... 156/600, 621, 624, DIG. 62, 156/DIG. 115; 422/245, 253

[56] References Cited

U.S. PATENT DOCUMENTS

| | | | |
|---|---|---|---|
| 4,909,933 | 3/1990 | Carter et al. | 210/95 |
| 5,013,531 | 5/1991 | Synder et al. | 156/DIG. 62 |
| 5,106,592 | 4/1992 | Stapelmann et al. | 156/DIG. 62 |

OTHER PUBLICATIONS

Snyder et al. "Protein Crystallization Facilities for Microgravity Experiments" Journal of Crystal Growth vol. 110, No. 1-2 (Mar. 1991) pp. 333-338.

*Primary Examiner*—Robert Kunemund
*Attorney, Agent, or Firm*—Evenson, McKeown, Edwards & Lenahan

[57] ABSTRACT

An arrangement for mixing fluids and for growing crystals by the vapor diffusion method under conditions of weightlessness has an exterior housing containing a mixing part and a reaction part. The mixing part has two cylinders in which the starting fluids are stored until the reaction is to be performed. Each cylinder has a piston associated therewith, and internal bores permit the starting fluids to be pumped between the respective cylinders to mix them. Following mixing, the fluids are pumped through a central bore to a cylinder in the reaction part, which also has a piston associated therewith. Withdrawal of the cylinder relative to the piston causes the formation of a drop, permitting the crystallization to take place. Following completion of the reaction, the cylinder is returned to its original position, sucking the fluid into it.

20 Claims, 11 Drawing Sheets

FIG. 1a
DEACTIVATED
FIG. 2a
PUMPING/MIXING
SECTIONAL VIEW
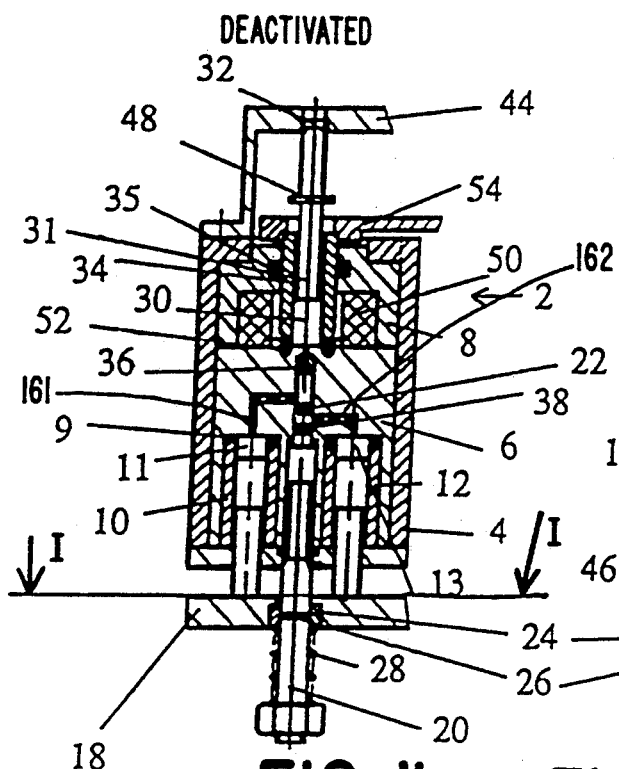
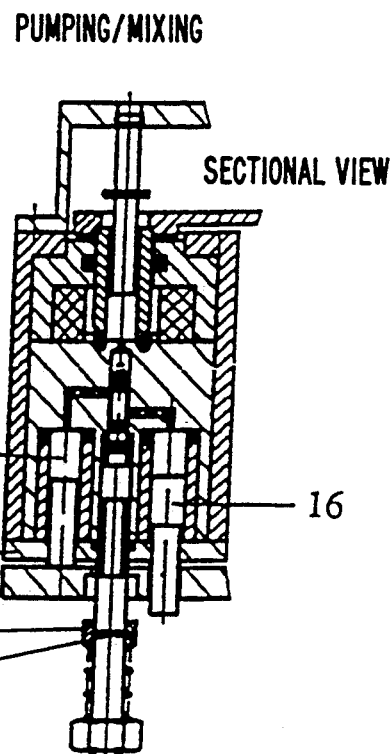
FIG. 1b
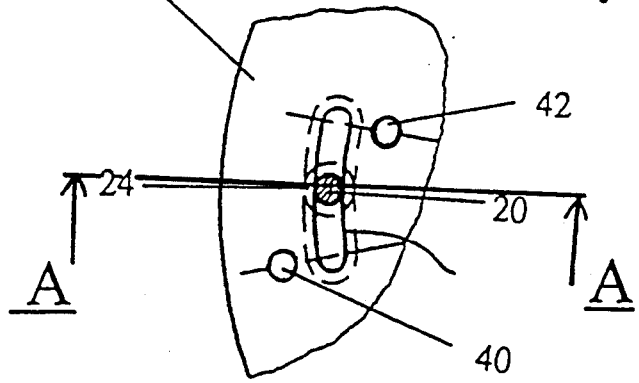
FIG. 2b
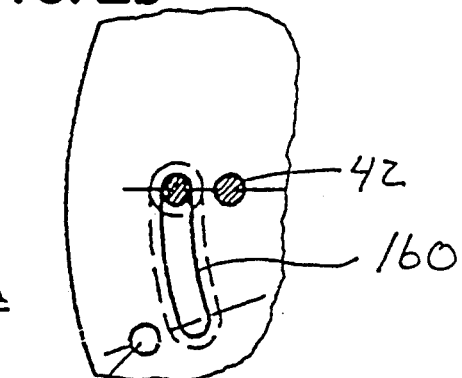
FIG. 2c
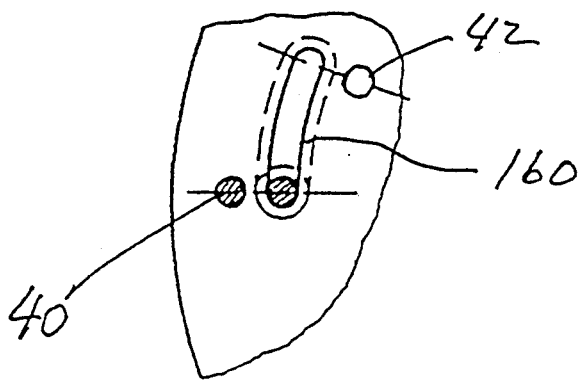

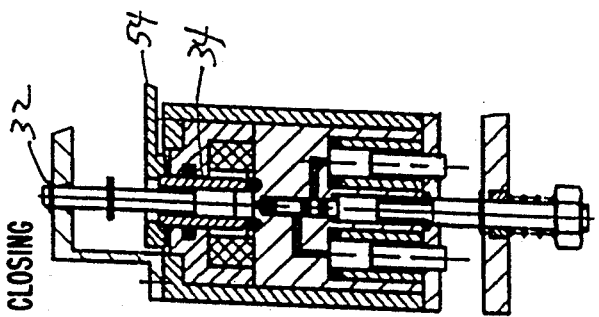
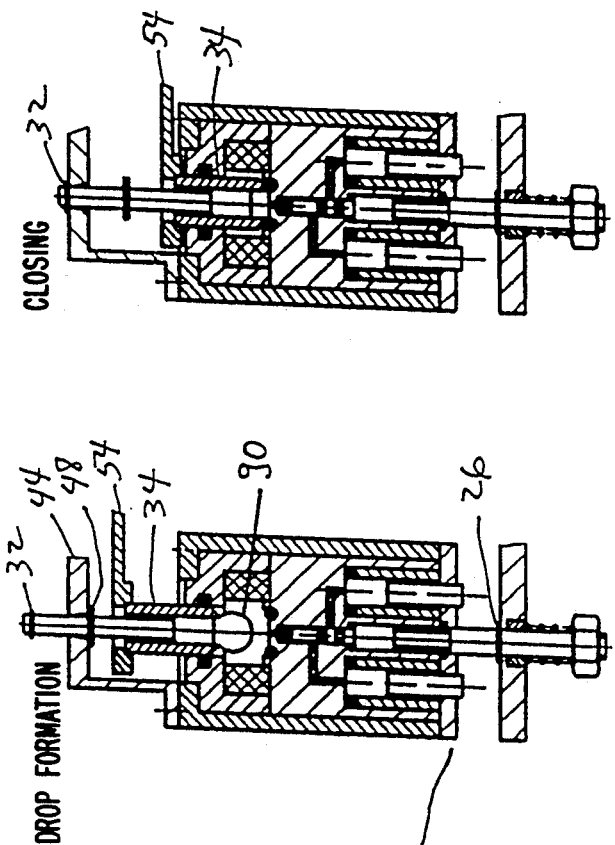
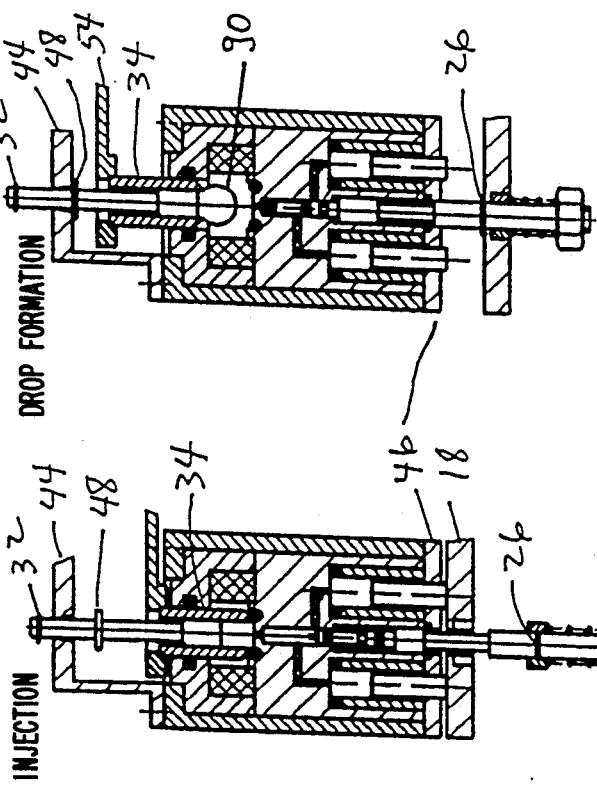
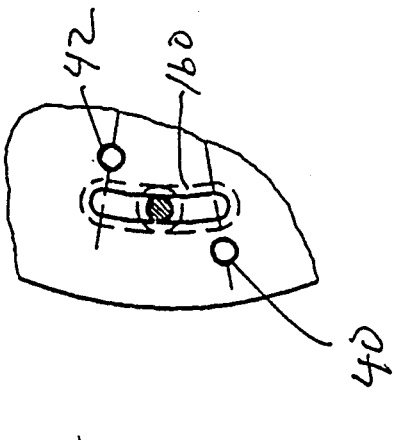
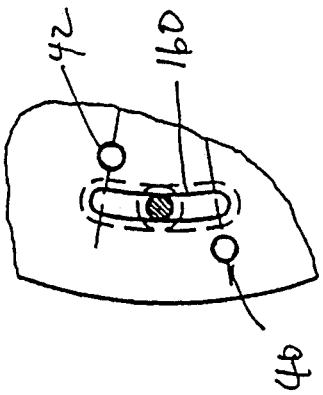

DEACTIVATED

PUMPING/MIXING

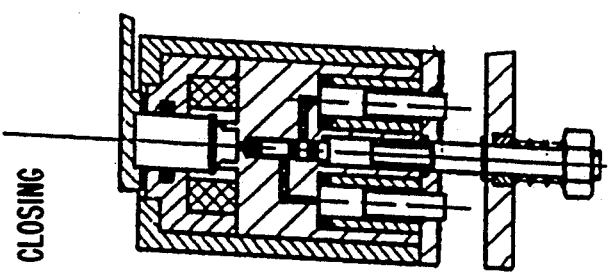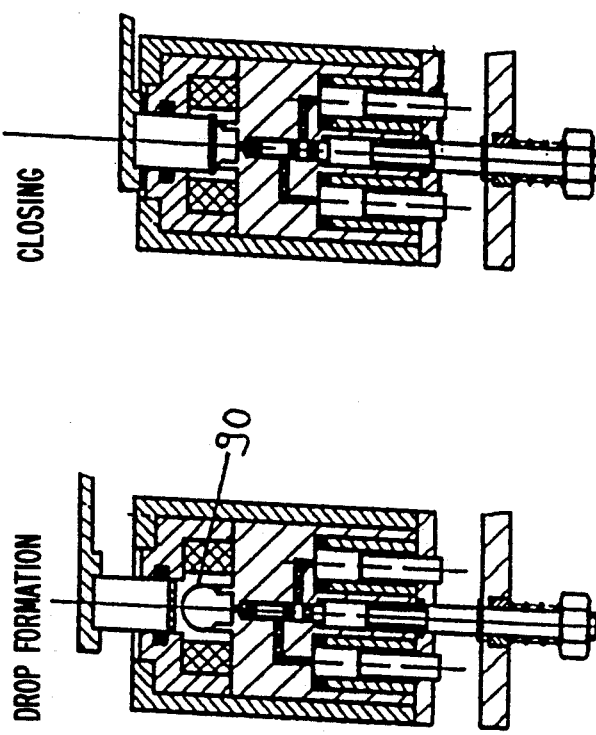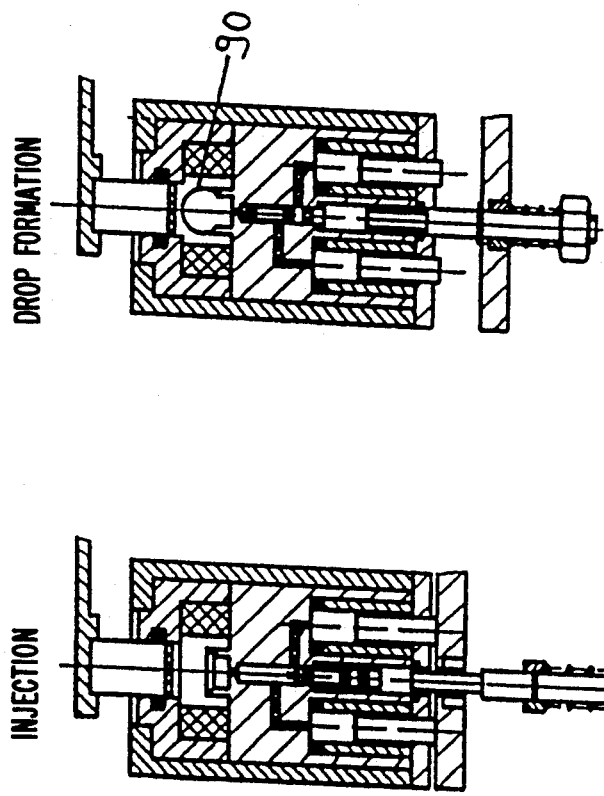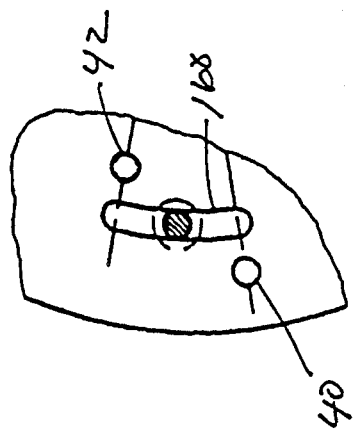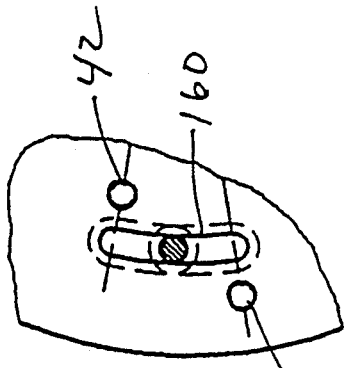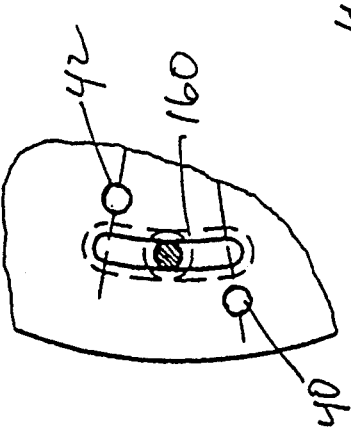

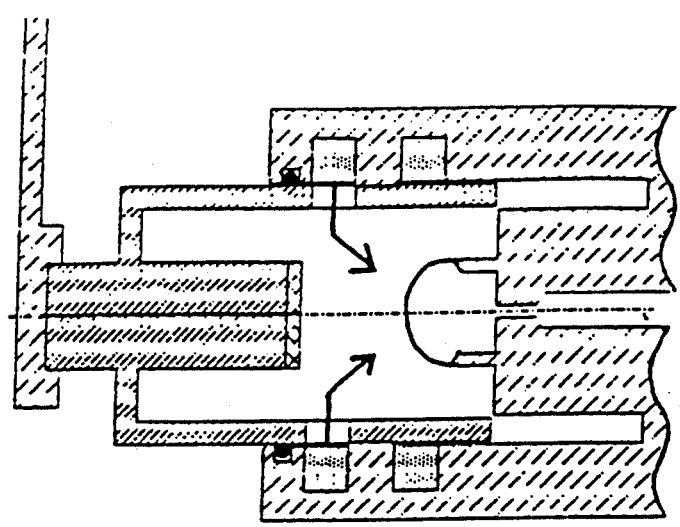
FIG. 11 DEACTIVATED
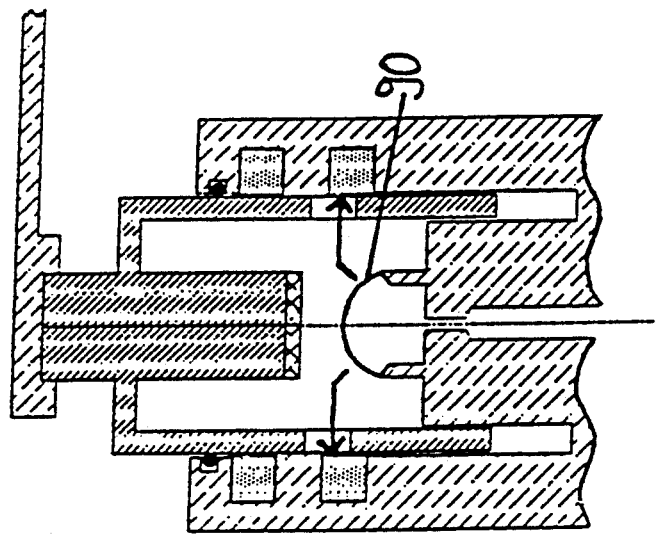
FIG. 12 INCREASE OF CONCENTRATION
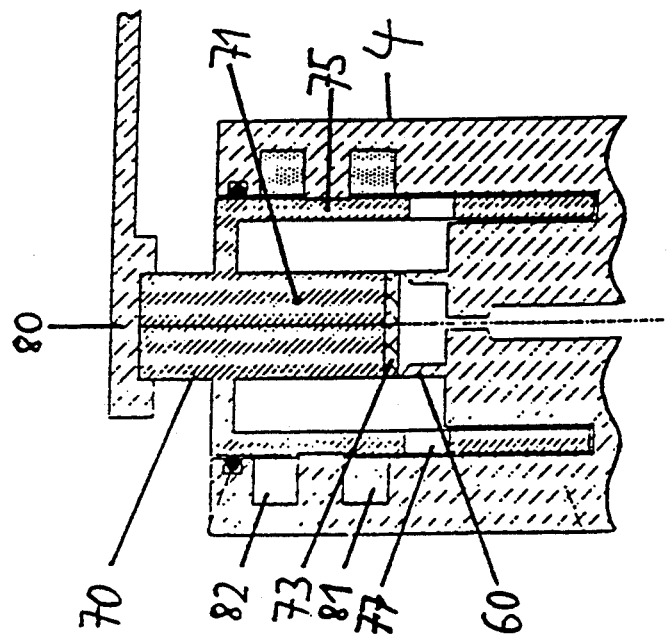
FIG. 13 DECREASE OF CONCENTRATION

DEACTIVATED

SECTIONAL VIEW

DROP FORMATION

INCREASE OF CONCENTRATION

DECREASE OF CONCENTRATION

ARRANGEMENT FOR CARRYING OUT CRYSTAL GROWING EXPERIMENTS UNDER CONDITIONS OF WEIGHTLESSNESS

BACKGROUND AND SUMMARY OF THE INVENTION

This invention relates to an arrangement for mixing fluids and for growing crystals according to the vapor diffusion method, particularly under conditions of weightlessness.

For crystal growth experiments, it has been found to be advantageous first to transport a protein solution and a precipitating agent separately, and to mix them at the site of crystallization. This applies also to the selective feeding of a seed crystal into an already mixed protein solution immediately before the start of the crystallization.

In the "hanging-drop" method of crystal growth, a drop with a starting volume $V_1$ of an unsaturated solution is suspended and slowly evaporated to a smaller volume $V_2$ so that a desired supersaturation of the dissolved substance occurs, which leads to the crystallization of this substance. This method can also be carried out under conditions of reduced gravity, in which larger drops and larger crystals can be produced.

In contrast to an earth borne application, however, an arrangement that is suitable for space must have the following characteristics:

Before the beginning of the experiment, the starting constituents must be stored in a tightly sealed manner.

If possible, the mixing should take place without manual intervention.

If possible, the drop should be produced without manual intervention.

If possible, the feeding of the seed crystals should take place without manual intervention.

After completion of the process, the fluid must again be stored in a tightly sealed manner, and must fill the storage vessel completely. Gas bubbles or similar phenomena must be avoided because otherwise the crystals may be destroyed during return to earth. So that a return can be ensured that is free of gas bubbles, the volume in which the crystallization product is returned is calculated in advance, and the container is dimensioned accordingly.

It is an object to the present invention to provide an arrangement for carrying out crystal growing experiments, particularly under conditions of weightlessness, by which the starting fluids can be transported separately and can be mixed at the desired point in time.

Other objects, advantages and novel features of the present invention will become apparent from the following detailed description of the invention when considered in conjunction with the accompanying drawings.

BRIEF DESCRIPTION OF THE DRAWINGS

FIGS. 1.*a*, 2.*a*, 3.*a*, 4.*a* and 5.*a* are views of a first embodiment of the invention in different operational states;

FIGS. 1.*b*, 2.*b*, and *c*, 3.*b*, 4.*b* and 5.*b* are sectional views of FIGS. 1.*a*–5.*a* respectively, along line I—I in FIG. 1.

FIGS. 6.*b*, 7.*b* and *c*, 8.*b*, 9.*b* and 10.*b* are sectional views of FIGS. 6.*a*–10.*a* respectively, along line VI—VI in FIG. 6.

FIGS. 11 to 13 show a modification of the embodiment illustrated in FIGS. 6 to 10;

DETAILED DESCRIPTION OF THE DRAWINGS

Figure 6A:
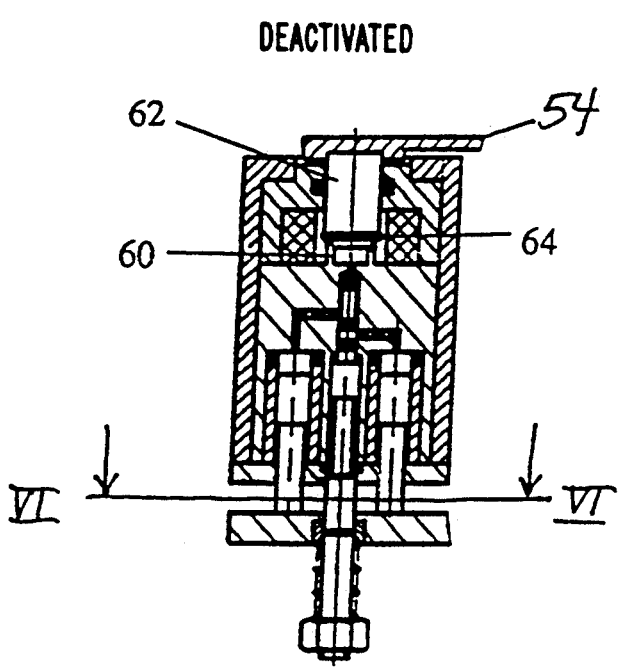
FIGS. 6.*a*, 7.*a*, 8.*a*, 9.*a* and 10.*a* are views of a second embodiment of the invention in different operational states.
Figure 7A:
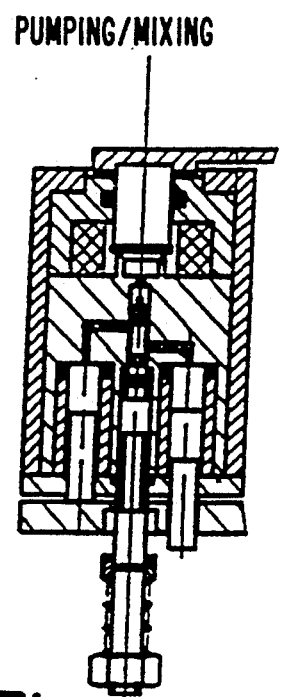
Figure 6B:
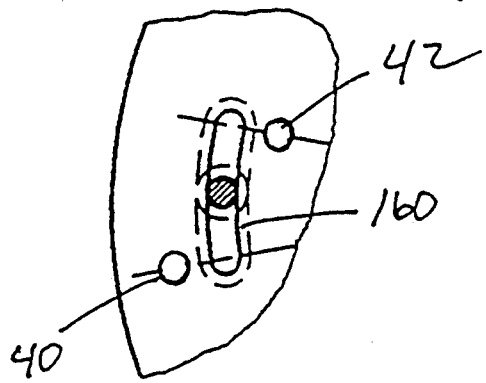
Figure 7B:
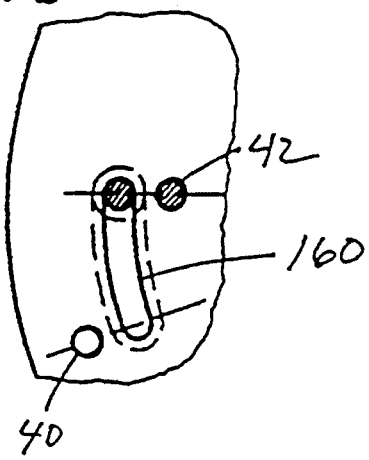
Figure 7C:
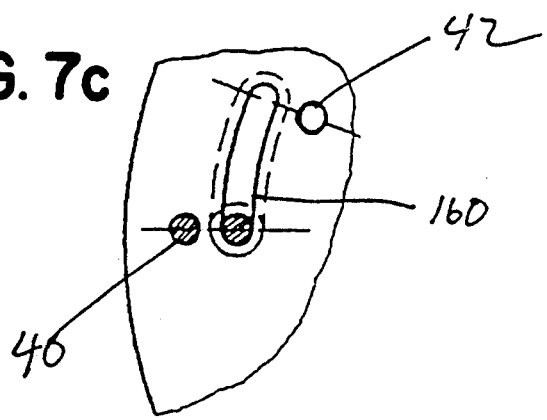

FIG. 1*a* illustrates an arrangement 2 for mixing fluids and growing crystals according to the invention. Inside an exterior housing 4, two components 6 and 8 are situated which house additional components of the arrangement 2. The first component 6 is called a mixing part, and the second component 8 is called a reaction part.

Inside the mixing part 6 are one central and two lateral bores. Each of the lateral bores accommodates a cylinder 10, 12, (preferably glass), which is sealed off from the mixing part 6 by means of O-ring seals 9. Inside the mixing part 6, additional bores 161, 162 are provided which permit a connection between the lateral bores and the central bore. Two different fluids, the protein solution 11 and the precipitating agent 13, are situated in the cylinders 10 and 12 and ca be sealed off and moved by pistons 14 and 16 respectively and by O-ring sealing devices. The pistons 14 and 16 can be pressed into the cylinders 10 and 12 by means of a plate 18. In the central bore, a slide 20 is provided which first seals off the two fluids with respect to one another (FIG. 1*a*). The sealing takes place either as illustrated by means of an O-ring 22 or directly by means of surface sealing.

The pistons 14 and 16 and the slide 20 are moved by means of plate 18, which, as shown in FIGS. 1.*b*, 2.*b* and *c* and 3.*a*–5.*a*, has recesses 40, 42 positioned to align with the pistons 14, 16 in such a manner that selectively either one or the other piston is released, or is moved along, as shown in FIGS. 2.*a* and 2.*b*. In FIG. 2.*a*, the plate 18 is positioned with the opening 42 opposite piston 16 so that at the plate 18 is moved upwardly, piston 16 can project through opening 42, and thus is free to move downwardly in response to a flow of fluid into chamber 13. In FIG. 2.*c*, plate 18 is positioned with opening 40 opposite piston 14. The slide 20 can be withdrawn by way of the driving device 24, which extends through an elongated slot 160 in plate 18. After the spring ring 26 has been pressed out, slide 20 can be pushed in again. In this case, the spring 28 promotes the withdrawal of the slide and prevents the premature jumping-out of the spring ring.

In the starting position, (FIG. 1*a*), an upper piston 30, movably arranged in a glass cylinder 34 in the reaction part 8, is positioned completely downward and is held in this position by means of push rod 31 and spring ring 32. (In a modified design, the cylinder 34, in which the piston 30 moves, may also be partially filled with a fluid which contains a seed crystal, and permits the carrying-out of the seed technique.) The glass cylinder 34 is sealed off with respect to the reaction part 8 by means of a sealing device 35.

FIG. 2*a* illustrates the second step in which the two fluids are mixed with one another. By the withdrawal of the slide 20 by means of the plate 18 and the driving device 24, to a point at which a constricted portion of the slide 20 is opposite the additional bores 161, 162 where they join the central bore, a connection is established between the two fluids, and at the same time, is sealed off toward the outside by means of the O-rings 36 and 38. The pistons 14 and 16 are then alternately moved upward by repeated raising and lowering of plate 18, which is shifted between the positions shown in FIGS. 2.b and 2.c in between each stroke. In this manner the fluids are injected into the respective other glass cylinder and are mixed with one another.

FIG. 3a then illustrates that, by means of a further withdrawal of the slide 20, the ends of additional bores 161 and 162 are opened to the central bore in such a manner that fluid can flow out of the lateral bores upwardly, through the central bore. By means of a simultaneous pressing-in of the two pistons 14 and 16 (FIGS. 3.a, 3.b), the mixture is pressed into the glass cylinder 34 of the reaction part 8, whereby the piston 30 is pushed out toward the top, and the spring ring 32 is pushed through an opening in the flange 44 and spreads open, whereby its diameter becomes larger than the opening. Subsequently, the slide 20, by way of the plate 18 and the driving device 24, is pulled out completely until it strikes against the plate 46 (FIG. 4.a). As a result of continued movement of the plate 18 and the driving device 24, the spring ring 26 slips out of the plate 18 and also spreads open, its diameter becoming larger than the recess in the plate 18 (FIG. 4a). Then the slide 20 is pressed in completely in the opposite direction by means of the plate 18 and the spring ring 26 and presses the residual fluid remaining in the duct into the upper glass cylinder 34 in the reaction part 8.

FIG. 4a shows that the glass cylinder 34 of the reaction part 8 is then moved upward until the stop 48 strikes against the plate 44. As the glass cylinder 34 is withdrawn, the fluid which was pumped into it is forced out of the end of the cylinder by piston 30, and is suspended in the form of a drop 90, in the chamber left by withdrawal of the cylinder.

Upon completion of the crystallization process, the glass cylinder 34 is pressed downward again by means of flange 54, against an O-ring 52. The spring ring 32 strikes against the plate 44 causing the piston 30 to come to a stop and suck the fluid into the glass cylinder as it continues to move. In this case, the end volume is firmly determined by the spring ring 32 and the plate 44, but the relative volume compensation can be freely selected by way of the initial filling amount and is precalculated.

FIGS. 6a to 10b show a variant of the arrangement according 1 to FIGS. 1a to 5b, in which a "sitting" drop 90 is formed at the start of the crystallization phase, rather than a suspended drop as shown in FIG. 4.a.

The mixing part 6 is identical with the one described above. However, the reaction part 8 has a stationary cylinder 60 into which the mixed starting fluids are injected, and at the end of which the drop is formed. After the crystallization, the cylinder 60 will take in the crystallization product and is sealed off by way of a plunger 62 having a sealing surface 64. This plunger 62, which can be moved by means of flange 54, is withdrawn before filling of the volume formed by the cylinder 60 and is pressed on again after the conclusion of the crystallization process.

During the charging of the volume formed by a cylinder 60, the amount of fluid may be selected such that a portion projects beyond the cylinder edge and a spherical interface is formed. This projecting part may be dimensioned such that, after the evaporation, the fluid ends flush with the cylinder 60 and is enclosed by the plunger 62 without any bubbles.

By partial charging of the volume formed by the cylinder 60 with a fluid which contains a seed crystal, it is also possible to apply the seed technique.

The formation of a "sitting drop" can be observed in that the plunger 62 is made of a transparent material, such as glass. It is also possible to make the plunger 62 out of a tube, such as an aluminum tube, with a lateral window. In both cases, the sealing surface 64 will then be constructed as a ring. Lighting may take place by a lateral light beaming.

FIGS. 11, 12, and 13 illustrate the reaction part of a variant of the arrangement according to FIGS. 6a to 10b, in which case a "sitting" drop is formed at the beginning of the crystallization phase. In this arrangement, the direction of the diffusion as well as its amount can be controlled. This is achieved by the use of two ring-shaped reservoirs 81, 82 which may accommodate various solutions (such as salt solutions of different concentrations). These reservoirs 81, 82 are first sealed off by way of the cylindrical wall 75 of the movable slide 70, the cylinder 60 simultaneously also sealed off (FIG. 11) by means of the sealing surface 73 of the central plunger 71.

To activate the crystallization process, the slide 70 is lifted and the drop 90 is formed. According to the position of the slide 70 and corresponding to the aperture 77 in the cylindrical wall 75, the diffusion takes place from the protein solution in the cylinder 60 to the reservoir 81 (FIG. 12) or from the reservoir 82 to the protein solution in the cylinder 60 (FIG. 13). A prerequisite for the indicated direction of the diffusion is that the salt solution in reservoir 81 has a lower vapor pressure than the protein solution and the salt solution in reservoir 82 has a higher vapor pressure than the protein solution. The diffusion direction is in each case indicated by arrows. The concentration of the protein solution can therefore be increased as well as reduced.

The extent of the diffusion and therefore the rate of change of the concentration, can be adjusted by the degree of overlap of the gap 77 with one of the reservoirs 81, 82.

To terminate the process, the position illustrated in FIG. 11 is taken up again. The initially selected amount of protein must be chosen such that the fluid meniscus at the end of the process coincides as flush as possible with the cylinder 60.

The described control of the diffusion requires no additional drive because it is connected with the closing mechanism of the cylinder 60. The principle of the diffusion control by means of the movable gap and two reservoirs, however, can also be implemented by a separate mechanism and can therefore also be used in the arrangement illustrated in FIGS. 1a to 5b.

FIGS. 14a to 17b show another arrangement by means of which the direction and amount of the diffusion can also be controlled. It comprises three housing parts 106, 102, 112 with the third (rotating part) 112 being rotatably disposed with respect to the second (center part) 102. In the first housing part 106, a glass cylinder 105 is glued into a central bore, a piston 140 being movably arranged in the glass cylinder 105. In the starting position, the protein solution 107 is situated in the glass cylinder 105. The center part 102 is provided with windows 100 which permit observation of the protein solution. This center part 102 is sealed off toward the outside by way of O-rings 104, 120 and a sealing washer 92 made of Viton, silicone rubber or a similar material. Two recesses 96 are situated in the wall of the center part 102 which borders on the rotating part 112. In indentations inside the rotating part 112, two reservoirs 130, 132 are disposed which contain, for example, salt solutions of different concentrations which are each saturated in porous materials. In each of the FIGS. 14a, 15a, 16a, and 17a a sectional view along Line A—A is illustrated in which the outlines of the reservoirs and recesses are projected perpendicularly onto the sectional plane FIGS. 14b, 15b, 16b, and 17b.

A sealing washer 92 is arranged between the rotating and the center part 112, 102. It also has recesses 93 which correspond to those 96 in the wall of the center part 102. The pressing-on of the sealing washer 92, also during the rotating, takes place by way of a tensioning nut 118, a disk spring 116 and a sliding disk 114.

Figure 14A:
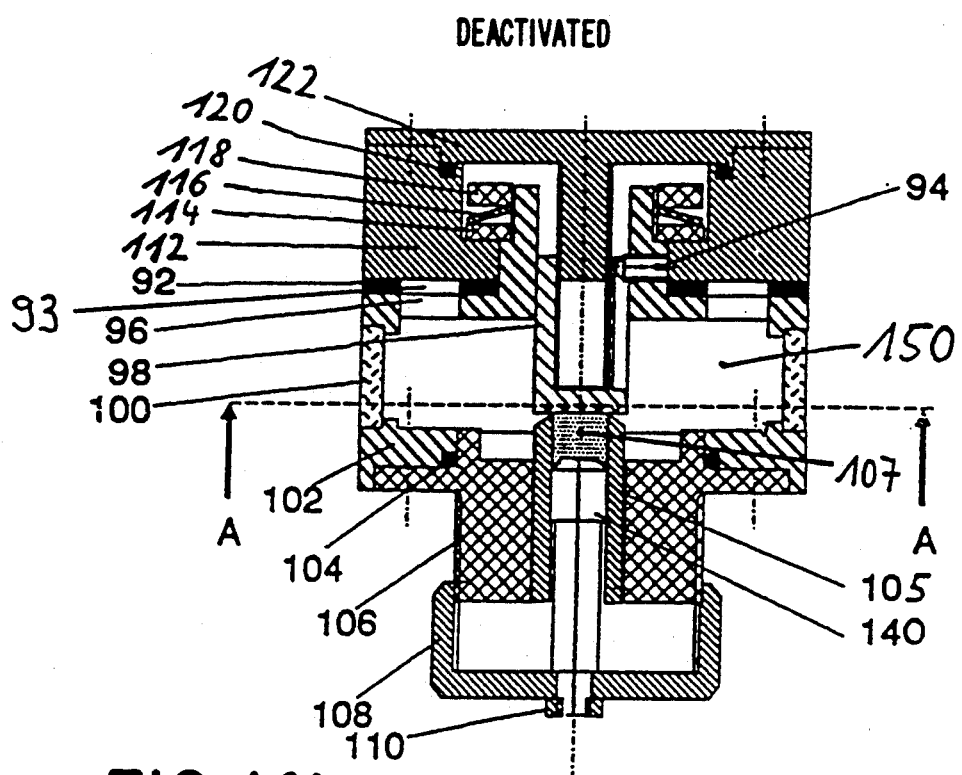
FIGS. 14*a*,14*b*,15*a*,15*b*,16*a*,16*b*,17*a* and 17*b* show another embodiment in different conditions.
Figure 14B:
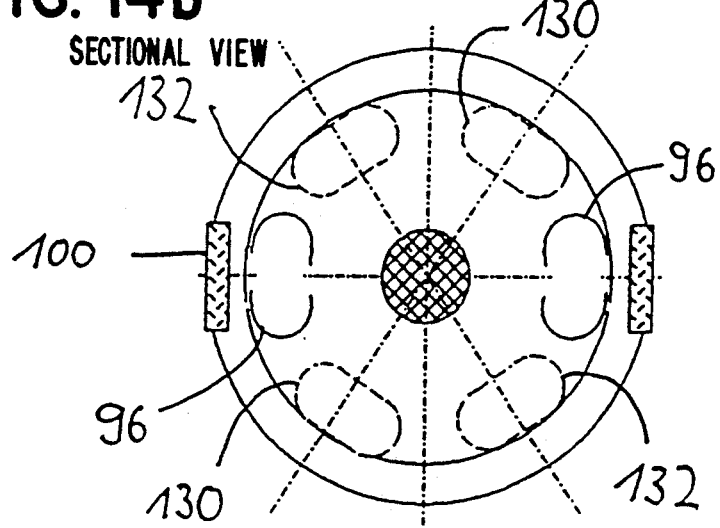

The reservoirs 130, 132 are separated by means of sealing washers 92 first from the interior 150 of the center part 102 since the outlines of the reservoirs 130, 132 and of the recesses 96 are not disposed above one another (FIGS. 14a and 14b). To activate the process, first the rotating part 112 is rotated several times, whereby the sealing plunger 98 is pulled up through an engaging thread of the component 122 because it is prevented from rotating along by means of a threaded pin 94.

Figure 15A:
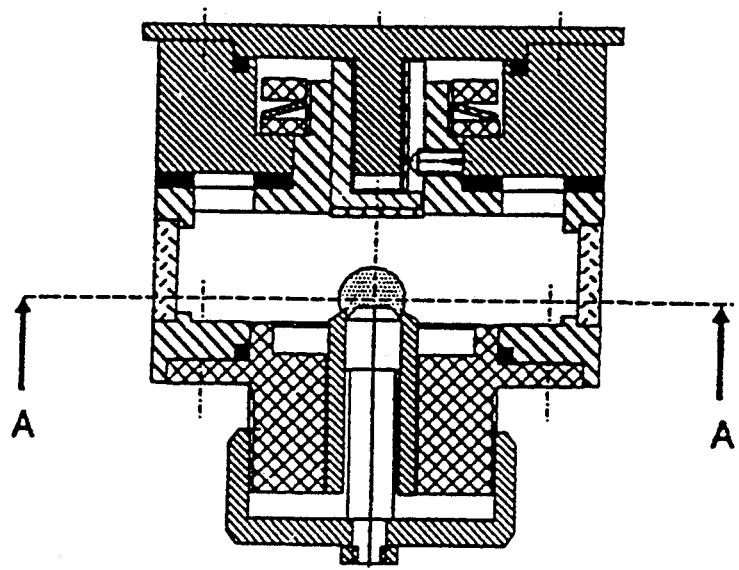
Figure 15B:
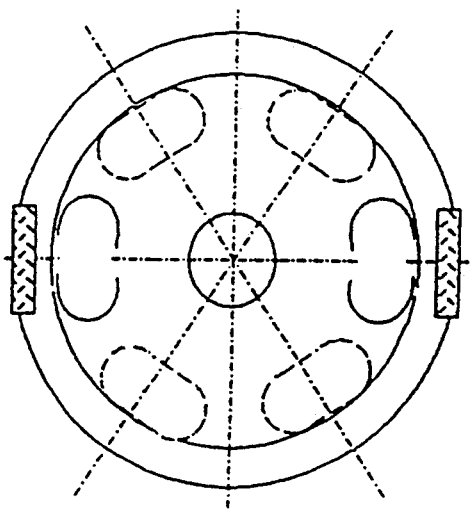
Figure 16A:
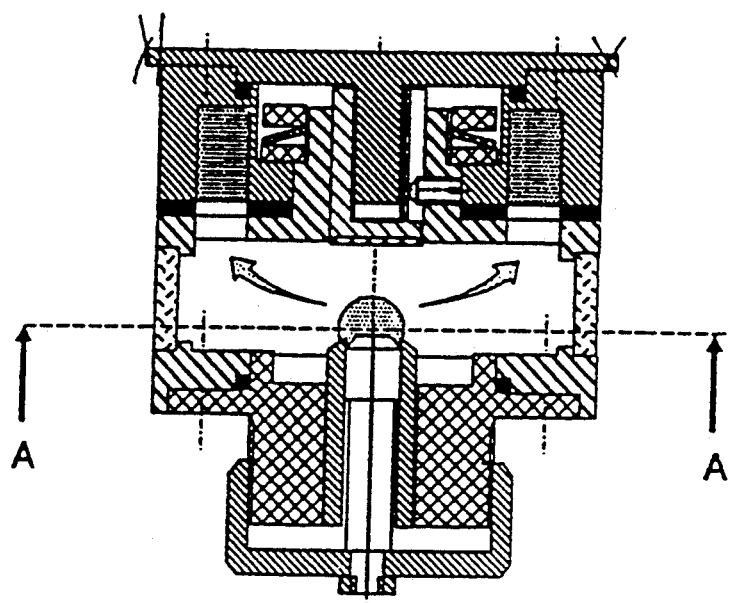
Figure 16B:
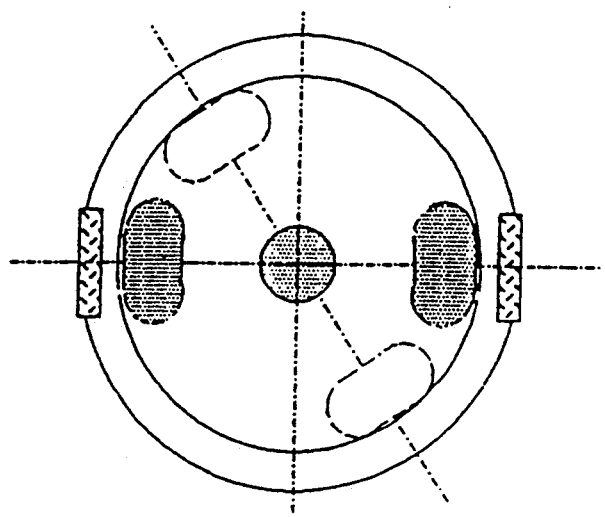

Subsequently, the drop is formed by pushing up the piston 140 fastened by means of a nut 110 to a screw cap 108 by the rotating of the screw cap 108 (FIGS. 15a and 15b).

Figure 17A:
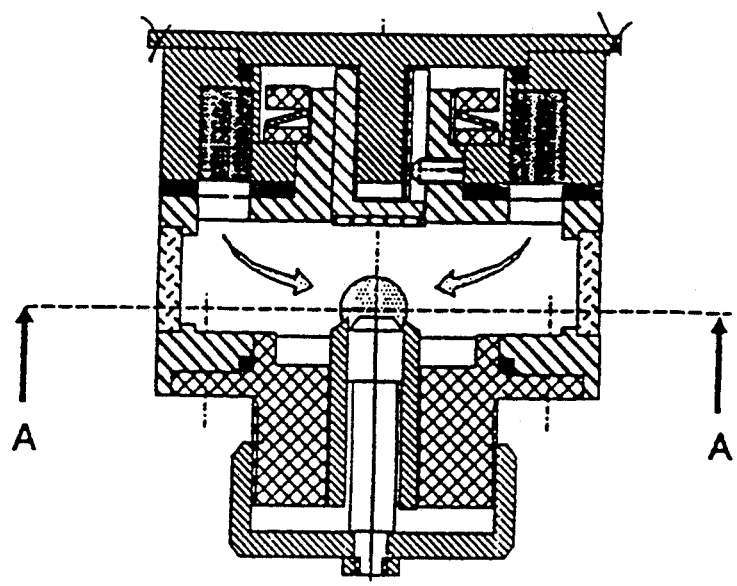
Figure 17B:
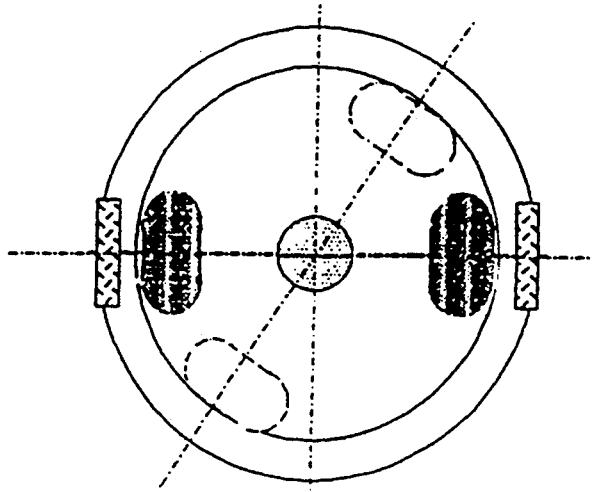

For the actual crystallization phase, the rotating part 112 is finally rotated so far that one of the reservoirs 130, 132 comes to be situated completely or partially over the recesses 96. As a result, a diffusion can take place from or to the drop of protein solution 107. According to whether the reservoir which, at the time, is connected with the drop has a lower or a higher vapor pressure than the drop, the concentration in the protein solution of the drop is increased (FIGS. 16a and 16b) or decreased (FIGS. 17a and 17b).

At the conclusion of the process, the piston 140 is withdrawn again, and the remaining protein solution together with the protein crystals is sucked into the glass cylinder 105, specifically to such extent that no more air is enclosed. By means of the rotation of the rotating part 112, the sealing plunger 98 is pressed onto the glass cylinder 105 and thus the protein solution is enclosed again (FIGS. 14a and 14b).

Instead of a first housing part 106, a mixing part 6 may be used, as illustrated in FIGS. 1 to 10, so that a mixing of the precipitating agent and the protein solution becomes possible.

The described sequence applies to the operation under conditions of weightlessness. For the operation under conditions of gravity, the whole arrangement must be rotated by 180° so that a hanging drop is formed.

Figure 18:
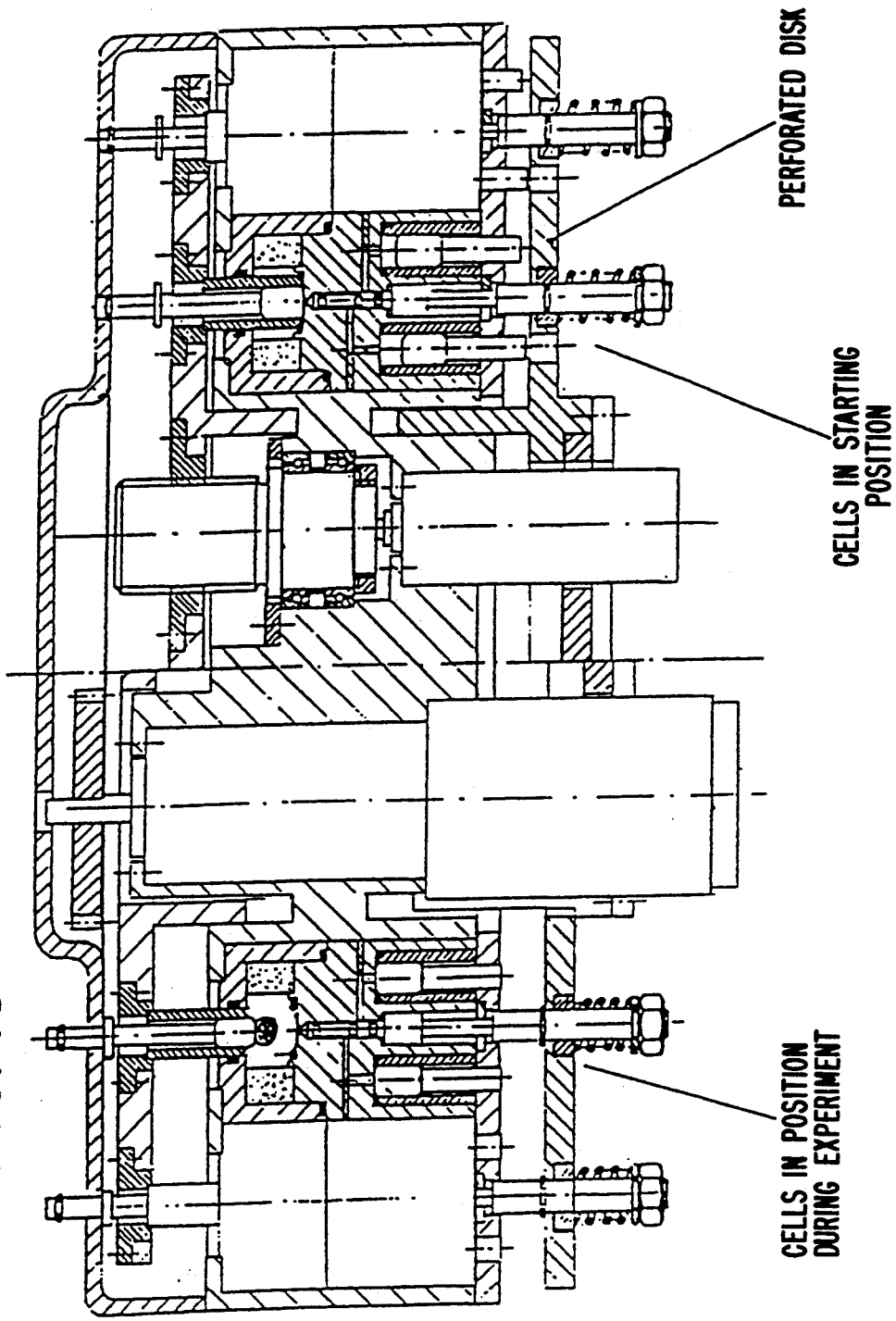
FIG. 18 is a sectional view of several arrangements forming a whole system.
Figure 19:
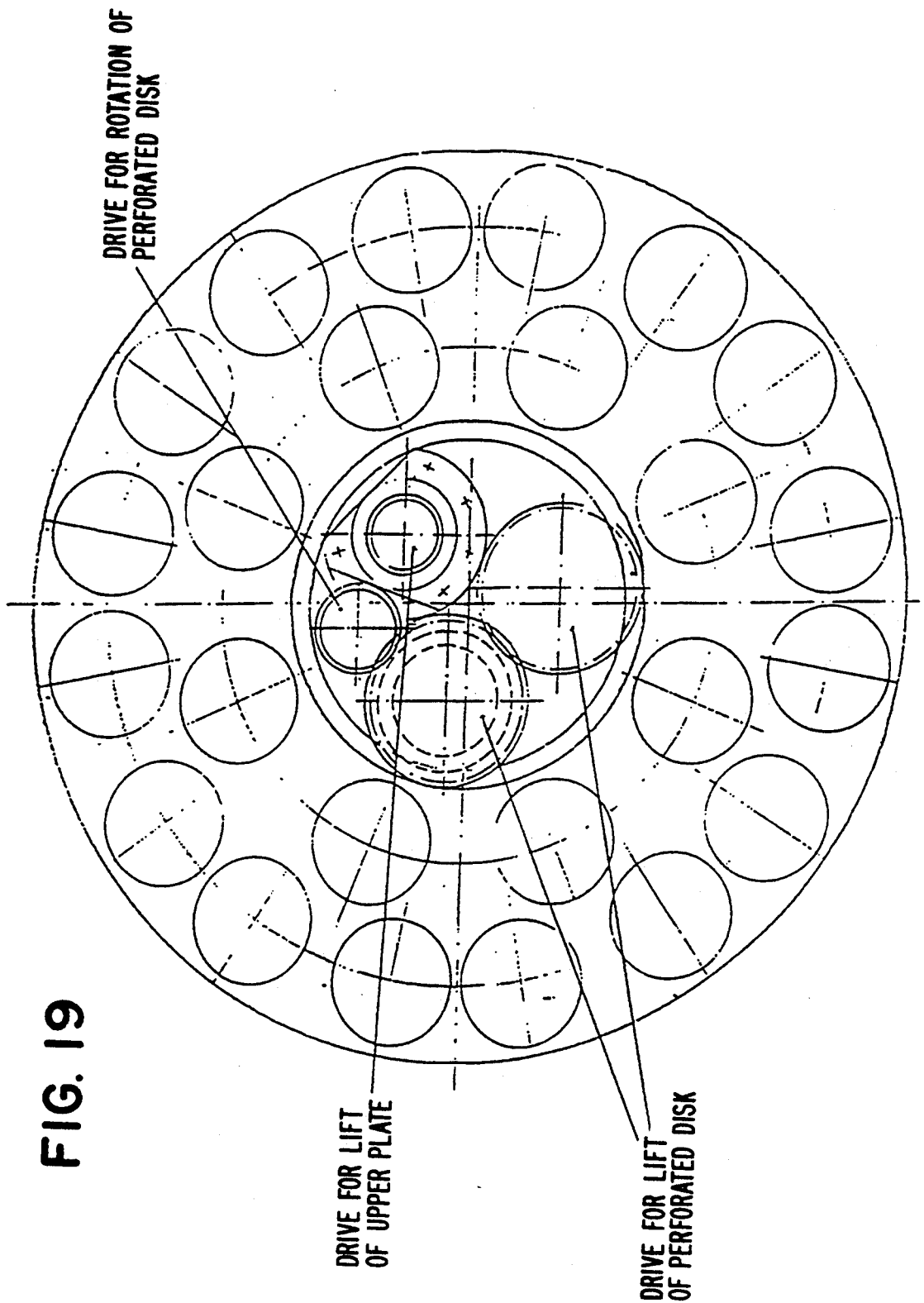
FIG. 19 is a top view of a system according to FIG. 18.

Several identical arrangements of the described apparatus may be combined into one system. Thus FIGS. 18 and 19 show a system of 24 arrangements. In this case, the drives for the lift of the component 54 and for the lift and rotation of the plate 18 are indicated. The left side of the system in FIG. 18 illustrates the cells in the position during the experiment, while the right half illustrates the cells in the starting position.

The movements of the component 54 and the plate 18 are carried out, for example, by means of electric motors which, as illustrated in FIG. 19, may be placed in the center of the system.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. An arrangement for mixing fluids and growing crystals by vapor diffusion, comprising:
   a housing having a mixing part and a reaction part situated therein;
   said mixing part having a central bore and at least two lateral bores;
   a slide situated in said central bore and having seals arranged thereon;
   at least two cylinders inserted in said at least two lateral bores respectively, in which cylinders said fluids are stored, each of said cylinders having a movable piston situated therein and being sealed by an O-ring seal;
   additional bores which permit a connection to be made between the central bore and the lateral bores when said slide is moved to a predetermined position;
   said reaction part having a first central bore having a diameter in which a reservoir is arranged and a second central bore having a diameter narrower than that of said first central bore;
   a cylinder movably arranged in said second central bore and means for sealing said second central bore with respect to said reaction part;
   a piston arranged in said cylinder and comprising a push rod on which an adjustable stop and a spring ring are mounted;
   a first plate mounted on the housing and provided with an opening through which the push rod can penetrate;
   a second plate arranged on an end of the housing opposite the first plate, said second plate having recesses through which the slide and push rods of the pistons can project;
   means fastened to the cylinder arranged in said second central bore, for moving said cylinder; and
   a liftable, lowerable and rotatable plate having recesses through which the slide and the push rods of the pistons can project, the recess for the slide being provided in the form of an oblong hole, and a receiving device for a driving device enclosing the slide being mounted in the rotatable plate, and the driving device being held on the slide by means of a spring ring.

2. An arrangement for mixing fluids and growing crystals by vapor diffusion, comprising:
   a housing having a mixing part and a reaction part situated therein;
   said mixing part having a central bore and at least two lateral bores;
   a slide situated in said central bore and having seals arranged thereon;
   at least two cylinders inserted in said at least two lateral bores respectively, in which cylinders said fluids are stored, each of said cylinders having a movable piston situated therein;

additional bores which permit a connection to be made between the central bore and the lateral bores which said slide is moved to a predetermined position;

a cylinder connected with the central bore;

said reaction part having a first central bore in which a reservoir is arranged, and a second central bore with a diameter that is narrower than that of said first central bore;

a plunger movably arranged in said second central bore, said plunger having a sealing surface and being sealed off from the material of the reaction part;

a plate connected with the housing and having recesses through which the slide and the push rods of the pistons project, and a liftable, lowerable and rotatable plate having recesses through which the slide and push rods for the pistons can project, the recess for the slide being provided in the form of an oblong hole and a receiving device for a driving device enclosing the slide being mounted in the plate, and the driving device being held on the slide by means of a spring ring.

3. An arrangement for mixing fluids and growing crystals by vapor diffusion, comprising:

a housing having a mixing part and a reaction part situated therein;

said mixing part having a central bore and at least two lateral bores;

a slide situated in said central bore and having seals arranged thereon;

at least two cylinders inserted in said at least two lateral bores respectively, in which cylinders said fluids are stored, each of said cylinders having a movable piston situated therein;

additional bores which permit a connection to be made between the central bore and the lateral bores which said slide is moved to a predetermined position;

a cylinder connected with the central bore;

two ring-shaped reservoirs which are worked into the frame component;

a second slide which is guided inside the frame component, comprising a central plunger with a sealing surface, and a cylindrical wall which is penetrated by a gap;

a plate connected with the housing and having recesses through which the slide and the push rods of the pistons project, and a liftable, lowerable and rotatable plate having recesses through which the slide and push rods for the pistons can project, the recess for the slide being provided in the form of an oblong hole, and a receiving device for a driving device enclosing the slide being mounted in the plate, and the driving device being held o the slide by means of a spring ring.

4. An arrangement according to claim 1 wherein the material of the mixing part consists of glass, the bores being constructed such that the pistons move directly in the bores.

5. An arrangement according to claim 2 wherein the material of the mixing part consists of glass, the bores being constructed such that the pistons move directly in the bores.

6. An arrangement for growing crystals by vapor diffusion comprising first, second and third housing parts;

said first housing part comprising a central bore in which a cylinder is arranged, said cylinder having a piston movably arranged therein;

said second housing part having a central bore in which a sealing piston having an internal thread is movably arranged, an interior recess which is connected with the central bore, and at least one recess on a wall which borders on the third housing part;

said third housing part being rotatable with respect to the second part and comprising at least two reservoirs, a connection being achievable between at least one of said reservoirs and the interior of the second part by way of the recesses by means of a preselected positioning of said third housing part;

a sealing washer arranged between the second part and the third part, which washer is pressed onto the central part by means of a tensioning nut, a plate spring and a sliding disk also during the rotation, and which has recesses which are centered over the recesses of the center part;

a component fixedly connected with the third part and comprising an external thread which engages in the internal thread of the sealing piston; and a threaded pin which prevents the sealing plunger from rotating when the rotating part is rotated.

7. An arrangement according to claim 6 wherein the second housing part has windows which permit observation of the interior.

8. An arrangement according to claim 1 wherein the cylinders are made of glass.

9. An arrangement according to claim 2 wherein the cylinders are made of glass.

10. An arrangement according to claim 6 wherein the cylinders are made of glass.

11. An arrangement according to claim 1 wherein the sealing devices are O-rings.

12. An arrangement according to claim 2 wherein the sealing devices are O-rings.

13. An arrangement according to claim 5 wherein the sealing devices are O-rings.

14. An arrangement according to claim 1 wherein the sealing devices are made of silicone rubber.

15. An arrangement according to claim 2 wherein the sealing devices are made of silicone rubber.

16. An arrangement according to claim 5 wherein the sealing devices are made of silicone rubber.

17. An arrangement according to claim 1 wherein the sealing devices are made of polytetrafluor ethylene.

18. An arrangement according to claim 2 wherein the sealing devices are made of polytetrafluor ethylene.

19. An arrangement according to claim 3 wherein the sealing devices are made of polytetrafluor ethylene.

20. An arrangement according to claim 6 wherein the sealing devices are made of polytetrafluor ethylene.

* * * * *